US010782336B2

(12) United States Patent
Jenkins et al.

(10) Patent No.: US 10,782,336 B2
(45) Date of Patent: Sep. 22, 2020

(54) BTI DEGRADATION TEST CIRCUIT

(71) Applicant: International Business Machines Corporation, Armonk, NY (US)

(72) Inventors: Keith A. Jenkins, Sleepy Hollow, NY (US); Barry P. Linder, Hastings-on-Hudson, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 876 days.

(21) Appl. No.: 15/080,937

(22) Filed: Mar. 25, 2016

(65) Prior Publication Data

US 2017/0276728 A1 Sep. 28, 2017

(51) Int. Cl.
*G01R 31/3183* (2006.01)
*G01R 31/26* (2020.01)
*G01R 31/3193* (2006.01)

(52) U.S. Cl.
CPC ..... *G01R 31/2642* (2013.01); *G01R 31/3193* (2013.01)

(58) Field of Classification Search
CPC .............. G01R 31/3183; G01R 31/2642
USPC ..................................... 324/750.03
See application file for complete search history.

(56) References Cited

U.S. PATENT DOCUMENTS 6,879,177 B1 4/2005 Bolam et al.
8,542,030 B2 9/2013 Cher et al.
2006/0076972 A1* 4/2006 Walker ............... G01R 31/2642
324/762.09
2010/0231227 A1* 9/2010 Kwon ................ G01R 31/3004
324/537
2010/0318313 A1 12/2010 Agarwal et al.
(Continued)

FOREIGN PATENT DOCUMENTS

WO 9914611 A2 3/1999

OTHER PUBLICATIONS

John P. Keane "On-Chip Circuits for Characterizing Transistor Aging Mechanisms in Advanced CMOS Technologies"; Apr. 2010, pp. 1-8.

(Continued)

*Primary Examiner* — Melissa J Koval
*Assistant Examiner* — Courtney G McDonnough
(74) *Attorney, Agent, or Firm* — Cantor Colburn LLP; Vazken Alexanian

(57) ABSTRACT

Embodiments are directed to a system for measuring a degradation characteristic of a plurality of electronic components. The system includes a parallel stress generator communicatively coupled to the plurality of electronic components, and a serial electronic measuring component communicatively coupled to the plurality of electronic components. The parallel stress generator is configured to generate a plurality of stress signals, apply the plurality of stress signals in parallel to the plurality of electronic components and remove the plurality of stress signals from the plurality of electronic components. The serial electronic measuring component is configured to, subsequent to the removal of the plurality of stress signals, sequentially measure the degradation characteristic of each one of the plurality of electronic components in order to determine their degradation resulting from the applied stress signals.

25 Claims, 7 Drawing Sheets

(56) References Cited

U.S. PATENT DOCUMENTS

2013/0253868 A1* 9/2013 Bansal ............... G01R 31/2881
                                                    702/79
2013/0293250 A1   11/2013 McMahon et al.
2015/0185277 A1    7/2015 Montrose et al.
2015/0253808 A1    9/2015 Chadwick et al.

OTHER PUBLICATIONS

Fernandez et al., "AC NBTI studied in the 1 Hz-2 GHz range on dedicated on-chip CMOS circuits," International Electron Devices Meeting, IEEE, 2006, 4 pages.
Kim et al., "On-Chip Aging Sensor Circuits for Reliable Nanometer MOSFET Digital Circuits," IEEE Transactions on Circuits and Systems—II: Express Briefs, vol. 57, No. 10, 2010, pp. 798-802.

* cited by examiner

| | RING ENABLE | RING OUT | PULSE ENABLE | VDD RING | VDD PULSE | VGATE | VDRAIN | VMEASURE | VSOURCE | SCAN CLOCK | COMMENT |
|---|---|---|---|---|---|---|---|---|---|---|---|
| 1. RESET SCAN CHAIN | OFF | - | 0 | 1 | 0 | 0 | 0 | - | 0 | RESET | |
| 2. START RING | ON | CHECK | 0 | 1 | 0 | 0 | 0 | - | 0 | 0 | CHECK RINGING |
| 3A. STRESS NFETs | ON | CHECK | 1 | VRING | VSTRESS | 0 | 0 | 0 | 0 | 0 | STRESS PHASE |
| 3B. STRESS PFETs | ON | CHECK | 1 | VRING | VSTRESS | 0 | VSTRESS | 0 | VSTRESS | 0 | STRESS PHASE |
| 4A. MEASURE (NFET) | ON | - | 0 | VRING | VSTRESS | 0.5 | 0.05 | CHECK | 0 | CLOCK | CLOCK A SINGLE 1 THROUGH SCAN CHAIN, MEASURE IDRAIN |
| 4B. MEASURE (PFET) | ON | - | 0 | VRING | VSTRESS | 0.65 | 1.10 | CHECK | 1.155 | CLOCK | |

FIG. 6

BTI DEGRADATION TEST CIRCUIT

BACKGROUND

The present disclosure relates in general to testing of performance degradation in electronic circuit components. More specifically, the present disclosure relates to systems and methodologies that efficiently and effectively apply bias temperature instability (BTI) stress at various duty cycles to CMOS circuit components, measure post-stress circuit component performance characteristics and use the measured post-stress performance characteristics to estimate the circuit component's performance degradation due to aging mechanisms.

Digital circuits in electronic systems such as computer processors, handheld electronic devices and digital cameras may include CMOS (complementary metal-oxide semiconductor) components such as n-channel field-effect-transistors (NFETs) and p-channel field-effect-transistors (PFETs) arranged in a complimentary fashion to perform logical functions. The electrical performance (e.g., operating speed, drive strength, etc.) of circuits that include NFET and PFET electronic components may change over time as a result of transistor aging mechanisms such as negative-bias temperature instability (NBTI), positive-bias temperature instability (PBTI) and hot-carrier injection (HCI). A general trend toward decreasing field-effect-transistor (FET) device geometries (e.g., gate length) has increased their vulnerability to aging mechanisms.

Circuit components undergo various duty cycles in an integrated circuit (IC). For example, the amount of BTI degradation in FETs depends on the duty cycle (i.e., on/off times) of the applied gate voltage. Accordingly, it would be beneficial to estimate BTI degradation in FETs and other circuit components over a wide range of duty cycles.

However, known methods for estimating BTI degradation over a wide range of duty cycles are time consuming and inefficient. For example, a typical stress-and-measure sequence for estimating BTI degradation applies a BTI stress to an FET at a chosen duty cycle for a period of time. After the BTI stress is removed, performance characteristics of the FET are measured and used to estimate the BTI degradation over time. The stress-and-measure sequence must be repeated for each circuit component, as well as for the multiple selected duty cycles that are within the range of duty cycles under investigation.

BRIEF SUMMARY

Embodiments are directed to a system for measuring a performance characteristic of a plurality of electronic components. The system includes a parallel stress generator communicatively coupled to the plurality of electronic components, and a serial electronic measuring component communicatively coupled to the plurality of electronic components. The parallel stress generator is configured to generate a plurality of stress signals, apply the plurality of stress signals in parallel to the plurality of electronic components and remove the plurality of stress signals from the plurality of electronic components. The serial electronic measuring component is configured to, subsequent to the removal of the plurality of stress signals, sequentially measure the performance characteristic of each one of the plurality of electronic components.

Embodiments are further directed to a system for measuring a performance characteristic of a plurality of electronic components. The system includes a parallel stress generator communicatively coupled to the plurality of electronic components, and a serial measuring controller including a plurality of switches, wherein the serial measuring controller is communicatively coupled to the plurality of electronic components. The system further includes an electronic measuring component communicatively coupled to the plurality of electronic components. The parallel stress generator is configured to generate a plurality of stress signals, apply the plurality of stress signals in parallel to the plurality of electronic components and remove the plurality of stress signals from the plurality of electronic components. The electronic measuring component is configured to measure the performance characteristic of each one of the plurality of electronic components. The serial measuring controller is configured to control the electronic measuring component to, subsequent to the removal of the plurality of stress signals, sequentially measure the performance characteristic of each one of the plurality of electronic components by sequentially controlling each one of the plurality of switches to sequentially couple each one of the plurality of electronic components to the electronic measuring component.

Embodiments are further directed to a system for estimating a performance degradation of a plurality of electronic components. The system includes a parallel pulse controller, along with a pulse generator communicatively coupled to the parallel pulse controller and the plurality of electronic components. The system further includes a serial measuring controller having a plurality of switches, wherein the serial measuring controller is communicatively coupled to the plurality of electronic components. The system further includes an electronic measuring component communicatively coupled to the plurality of electronic components, along with a performance degradation estimating component communicatively coupled to the electronic measuring component. The pulse generator is configured to generate a plurality of pulse signals including a plurality of duty cycles. The parallel pulse controller is configured to control the pulse generator to apply the plurality of pulse signals including the plurality of duty cycles in parallel to the plurality of electronic components, and then remove the plurality of pulse signals including a plurality of duty cycles from the plurality of electronic components. The electronic measuring component is configured to determine a measured performance characteristic of each one of the plurality of electronic components. The serial measuring controller is configured to control the electronic measuring component to, subsequent to the removal of the plurality of pulse signals, sequentially determine the measured performance characteristic of each one of the plurality of electronic components by sequentially controlling each one of the plurality of switches to sequentially couple each one of the plurality of electronic components to the electronic measuring component. The performance degradation estimating component estimates a performance degradation of each one of the plurality of electronic components based at least in part on the measured performance characteristic of each one of the plurality of electronic components. In one or more embodiments, the performance degradation is a difference between an initial performance characteristic of each one of the plurality of electronic components and the measured performance characteristic of each one of the plurality of electronic components.

Embodiments are further directed to a method for measuring a performance characteristic of a plurality of electronic components. The method includes utilizing a parallel stress generator to generate a plurality of stress signals, apply the plurality of stress signals in parallel to a plurality of electronic components and remove the plurality of stress signals from the plurality of electronic components. The method further includes, subsequent to the removal of the plurality of stress signals, utilizing a serial electronic measuring component to sequentially measure the performance characteristic of each one of the plurality of electronic components.

Embodiments are further directed to a method for measuring a performance characteristic of a plurality of electronic components. The method includes utilizing a parallel stress generator to generate a plurality of stress signals, apply the plurality of stress signals in parallel to the plurality of electronic components and remove the plurality of stress signals from the plurality of electronic components. The method further includes utilizing a serial measuring controller to control an electronic measuring component to, subsequent to the removal of the plurality of stress signals, sequentially measure the performance characteristic of each one of the plurality of electronic components by sequentially controlling each one of a plurality of switches to sequentially couple each one of the plurality of electronic components to the electronic measuring component.

Additional features and advantages are realized through the techniques described herein. Other embodiments and aspects are described in detail herein. For a better understanding, refer to the description and to the drawings.

BRIEF DESCRIPTION OF THE DRAWINGS

The subject matter which is regarded as the present disclosure is particularly pointed out and distinctly claimed in the claims at the conclusion of the specification. The foregoing and other features and advantages are apparent from the following detailed description taken in conjunction with the accompanying drawings in which:

FIG. 6 depicts a table illustrating an operating methodology of the system shown in FIG. 2 and the pulse generation circuit shown in FIG. 3.

Figure 1:
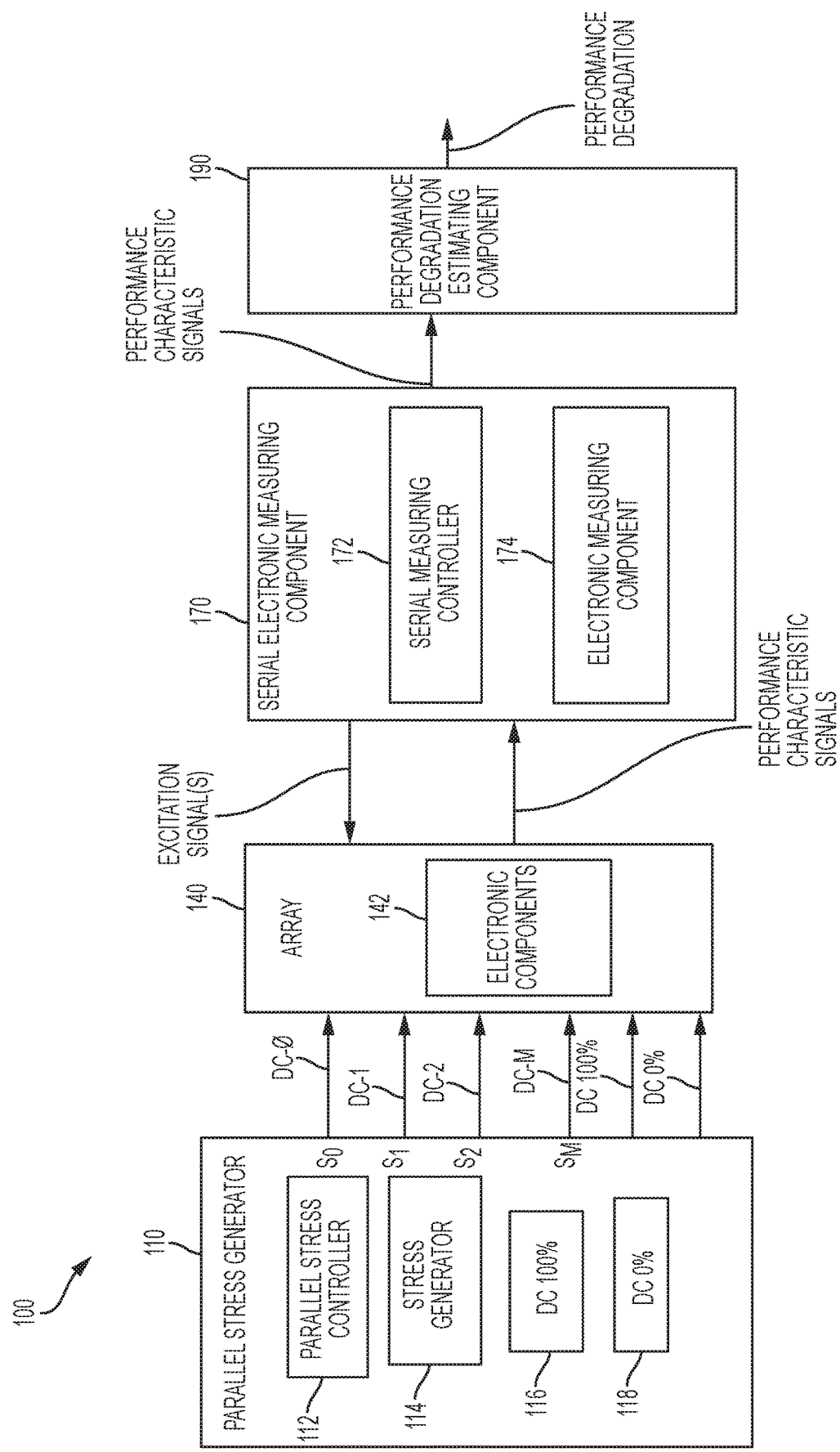
FIG. 1 depicts a block diagram of a system according to one or more embodiments.

In the accompanying figures and following detailed description of the disclosed embodiments, the various elements illustrated in the figures are provided with three or four digit reference numbers. The leftmost digit(s) of each reference number corresponds to the figure in which its element is first illustrated.

DETAILED DESCRIPTION

Various embodiments of the present disclosure will now be described with reference to the related drawings. It is noted that alternative embodiments may be devised without departing from the scope of this disclosure. Various connections and relationships are set forth between elements in the following description and in the drawings. These connections and relationships, unless specified otherwise, may be direct or indirect, and the present disclosure is not intended to be limiting in this respect. Accordingly, a coupling of entities may refer to either a direct or an indirect connection. Additionally, an operation that is performed subsequently with respect to a preceding operation may or may not involve one or more intermediate operations between the preceding operation and the subsequent operation. Furthermore, although embodiments of the present disclosure are provided in connection with PFET electronic components, the teachings of the present disclosure apply equally to other similar electronic components such as NFETs.

Digital circuits in electronic systems such as computer processors, handheld electronic devices and digital cameras include ICs having NFETs and PFETs arranged in a complimentary fashion to perform logical functions. The electrical performance of ICs that include CMOS electronic components such as NFETs and PFETs may change by an unacceptable amount as a result of transistor aging mechanisms such as NBTI, PBTI and HCI. For example, NBTI degradation is the result of negative voltage applied to the gate of an FET with respect to the source and/or drain of the FET. If the negative gate voltage is applied for a sufficient period of time, NBTI aging mechanisms can change the threshold voltage ($V_T$) of the FETs outside a certain range, which can vary the performance of the IC (e.g., slow the IC down) by an unacceptable amount. The amount of BTI degradation depends on the amount of time the negative gate voltage is on or off. Additionally, FET components exposed to BTI stress (e.g., the negative gate voltage) have the ability to recover during periods when the BTI stress is not being applied. Accordingly, the amount of BTI degradation that will occur in a given FET component depends the duty cycle of the BTI stress applied to the FET.

During development of ICs having CMOS devices such as PFETs and NFETs, it is important to make an estimate of the expected BTI degradation in the CMOS devices. For improved modeling and monitoring of IC operation, it is advantageous to measure BTI degradation in circuit components over a wide range of duty cycles. A typical stress-and-measure sequence for estimating BTI degradation applies a BTI stress to a circuit component at a chosen duty cycle for a period of time. After the BTI stress is removed, one or more performance characteristics of the circuit component are measured and used to estimate the BTI degradation that will occur in the circuit component over time. The stress-and-measure sequence must be repeated for each circuit component, as well as for the multiple selected duty cycles that are within the range of duty cycles under investigation. Accordingly, given that a typical stress-and-measure sequence can last approximately 10,000 seconds, and given that an IC may include as many as 10 million FET circuit components or more, serially applying a 10,000 second stress-and-measure sequence to each one of multiple FETs for each one of multiple duty cycles under investigation is inefficient and time consuming. Accordingly, it would be beneficial to estimate the degradation for many different devices at many different duty cycles.

Turning now to an overview of the present disclosure, one or more embodiments provide systems and methodologies for estimating performance degradation in CMOS circuit components. In one or more embodiments, the present disclosure provides systems and methodologies that efficiently and effectively apply BTI stress in parallel and at various duty cycles to circuit components, remove or discontinue the BTI stress, sequentially measure one or more circuit component performance characteristics subsequent to the removal of the BTI stress, and use the one or more measured circuit component performance characteristics to determine an estimate of the circuit component's performance degradation due to aging mechanisms.

In one or more embodiments, the present disclosure may be implemented as a system having a parallel pulse controller, along with a pulse generator communicatively coupled to the parallel pulse controller and an array of electronic components. The system further includes a serial measuring controller having a plurality of switches, wherein the serial measuring controller is communicatively coupled to the array of electronic components. The system further includes an electronic measuring component communicatively coupled to the array of electronic components, along with a performance degradation estimating component communicatively coupled to the electronic measuring component.

In operation, the pulse generator generates a plurality of pulse signals including a plurality of duty cycles. The parallel pulse controller controls the pulse generator to apply the plurality of pulse signals at the plurality of duty cycles in parallel to the electronic components. The parallel pulse controller further controls the pulse generator to remove the plurality of pulse signals from the electronic components after the plurality of duty cycles have completed. The electronic measuring component measures or determines one or more measured performance characteristics of each one of the electronic components. The serial measuring controller is configured to control the electronic measuring component to, subsequent to the removal of the plurality of pulse signals, sequentially (i.e., serially, one after another) determine or measure the one or more measured performance characteristics of each one of the electronic components by sequentially controlling each one of the plurality of switches to sequentially couple each one of the electronic components to the electronic measuring component. The performance degradation estimating component estimates a performance degradation of each one of the electronic components based at least in part on the one or more measured performance characteristics of each one of the electronic components. In one or more embodiments, the performance degradation is a difference between initial one or more performance characteristics of each one of the electronic components and the one or more measured performance characteristic of each one of the electronic components.

In one or more embodiments, the pulse generator may be implemented as a pulse generation circuit designed and/or configured to generate the plurality of pulse signals at the plurality of duty cycles. In one or more embodiments, the pulse generation circuit may be implemented as a ring oscillator circuit. In one or more embodiments, the serial measuring controller may be implemented as a scan chain or a state machine, wherein the scan chain or the state machine is configured to sequentially control one of the plurality of switches to sequentially couple each one of the electronic components to the electronic measuring component. In one or more embodiments, the electronic components are implemented as FETs, wherein each one of the FETs includes a gate, a source and a drain, and wherein the parallel pulse controller controls the pulse generator to apply the plurality of pulse signals at the plurality of duty cycles in parallel to the gates of the FETs. The scan chain or the state machine is used to sequentially control each one of the plurality of switches to sequentially pass an excitation voltage to the gate of each one of the FETs and sequentially couple each one of the FETs to the electronic measuring component.

In one or more embodiments, the above-described ring oscillator circuit generates various BTI stress signals at various duty cycles in a range from 0% to 100% and applies the various BTI stress signals in parallel to the set of FET devices under test (DUT). The different duty cycles may be generated by tapping outputs from the ring oscillator circuit at various stages in the ring oscillator using NAND gates and inverter gates. The length of the ring oscillator determines the maximum number of different duty cycles that may be generated. In one or more embodiments, the range of attainable duty cycles may be increased by driving the ring oscillator with an off-chip clock signal. In one or more embodiments, the electronic measuring component may be an ammeter, and the measured performance characteristic is a source/drain current of the FET. The source/drain current is determined by using the scan chain or the state machine to sequentially couple a voltage to the gate of the DUT, and then using the ammeter to measure the source/drain current of the DUT.

The present disclosure may be implemented in a variety of configurations to provide feedback on performance degradation of electronic components due to aging mechanisms. For example, the present disclosure may be implemented inline as one or more operations of an IC fabrication process, as a bench test after IC fabrication, or as an on-chip system built into the IC.

Turning now to a more detailed description of the present disclosure, FIG. 1 depicts a block diagram of a system 100 according to one or more embodiments. As shown in FIG. 1, system 100 includes a parallel stress controller 110, an array 140 of electronic components 142, a serial electronic measuring circuit 170 and a performance degradation estimating component 190, configured and arranged as shown. Parallel stress generator 110 includes a parallel stress controller 112, a stress generator 114, a 100% duty cycle signal (DC) 116 and a 0% duty cycle signal (DC) 118. Serial electronic measuring component 170 includes serial measuring controller 172 and an electronic measuring component 174.

In operation, stress generator 114 generates M stress signals from $S_0$ to $S_M$, wherein M equals the total number of DCs (DC-0 to DC-M) of the stress signals generated by stress generator 114. DCs of 100% and 0% do not require stress generator 114 so may be supplied directly without the need for signal processing. Parallel stress controller 112 controls stress generator 114 to apply the stress signals $S_0$ to $S_M$ at the duty cycles DC-0 to DC-M, along with DC 100% 116 and DC 0% 118, in parallel to electronic components 142. Parallel stress controller 112 further controls stress generator 114 to remove the stress signals $S_0$ to $S_M$, along with DC 100% 116 and DC 0% 118, from electronic components 142 after the M stress signals have completed.

Electronic measuring component 174 measures or determines one or more measured performance characteristics of each one of electronic components 142. Serial measuring controller 172 controls electronic measuring component 174 to, subsequent to the removal of the stress signals $S_0$ to $S_M$, DC 100% 116 and DC 0% 118, sequentially (i.e., serially, one after another) determine or measure one or more measured performance characteristics of each one of electronic components 142 by sequentially coupling each one of electronic components 142 to an excitation signal, which allows one or more performance characteristics to be measured by electronic measuring component 174. Performance degradation estimating component 190 estimates a performance degradation of each one of electronic components 142 based at least in part on the one or more measured performance characteristics of each one of electronic components 142. In one or more embodiments, the performance degradation is a difference between an initial one or more performance characteristics of each one of electronic components 142 and the one or more measured performance characteristic of each one of electronic components 142.

System 100 may be implemented in a variety of configurations to provide feedback on performance degradation of electronic components due to aging mechanisms. For example, system 100 may be implemented inline as one or more operations of an IC fabrication process, as a bench test after IC fabrication, or as an on-chip system built into the IC.

Figure 2:
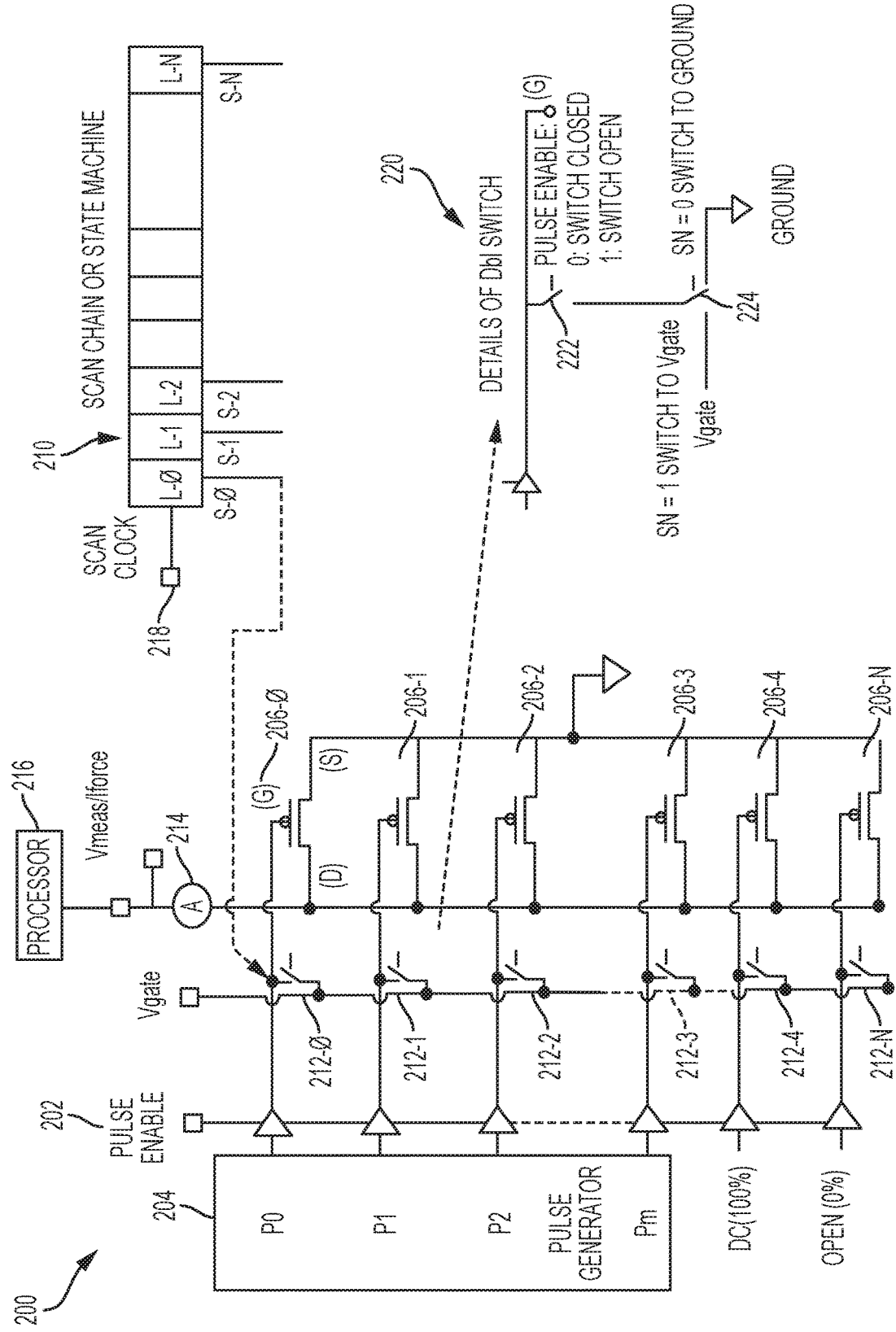
FIG. 2 depicts a schematic diagram of a system according to one or more embodiments.

FIG. 2 depicts a schematic diagram of a system 200 according to one or more embodiments. System 200 is a non-limiting example of how system 100 shown in FIG. 1 may be implemented. Referring now to FIG. 1 and FIG. 2, parallel stress controller 112 may be implemented as a pulse enable signal 202, stress generator 114 may be implemented as a pulse generator 204, electronic components 142 may be a plurality of PFETs 206-0 to 206-N (where N is the total number of PFETs), serial measuring controller 172 may be implemented as a scan chain or state machine 210 and a plurality of switches 212-0 to 212-N (where N is the total number of switches and PFETs), electronic measuring component 174 may be implemented as an ammeter 214, and performance degradation estimating component may be implemented as a processor system 216.

In operation, pulse generator 204 generates M pulse signals from $P_0$ to $P_M$, where M equals the total number of duty cycles (DC-0 to DC-M) generated by pulse generator 204. DCs of 100% and 0% do not require pulse generator 204 so may be supplied directly without signal processing. Pulse enable 202 controls pulse generator 204, DC 100% and DC 0% by enabling the pulse signals $P_0$ to $P_M$ generated at the duty cycles DC-0 to DC-M, along with DC 100% and DC 0% to pass in parallel to the gates G of PFETs 206-0 to 206-N. Pulse enable 202 further controls pulse generator 204 by disabling the pulse signals $P_0$ to $P_M$, DC 100% and DC 0% to thereby remove them from PFETs 206-0 to 206-N after the M stress signals have completed. Subsequent to the removal of the pulse signals $P_0$ to $P_M$, DC 100% and DC 0%, scan chain 210 controls switches 212-0 to 212-N to sequentially (i.e., serially, one after another) couple an excitation signal Vgate to each gate G of each PFET 206-0 to 206-N, which allows ammeter 214 to sequentially determine or measure the source/drain (S/D) current of each PFET 206-0 to 206-N. Processor system 216 estimates a performance degradation of each PFET 206-0 to 206-N based at least in part on the measured S/D current of each PFET 206-0 to 206-N. In one or more embodiments, the performance degradation is a difference between an initial S/D current of each PFET 206-0 to 206-N and the measured S/D current of each PFET 206-0 to 206-N.

Scan chain 210 includes an array of latches L-0 to L-N (where N is the total number of latches, switches and PFETs), and each latch is activated sequentially by a scan clock 218 to generate outputs S-0 to S-N (where N is the total number of latch outputs, latches, switches and PFETs), each of which is coupled to a corresponding switch 212-0 to 212-N. For example, output S-0 is coupled to switch 212-0, output S-1 is coupled to switch 212-1, output S-2 is coupled to switch 212-2, and so on. Thus, when scan clock 218 sequentially activates latches L-0 to L-N, which sequentially activates outputs S-0 to S-N, only one of outputs S-0 to S-N can be at a logical one (1) and the rest of outputs S-0 to S-N have to be at a logical zero (0). When a scan chain output is at a logical one (1), its corresponding switch is closed, which couples Vgate to the gate terminal G of its corresponding PFET. When a scan chain output is at a logical zero (0), its corresponding switch is open, which decouples Vgate from the gate terminal G of its corresponding PFET. For example, when S-0 is at a logical one (1), its corresponding switch 212-0 is closed, which couples Vgate to the gate terminal G of PFET 206-0. When S-0 is at a logical one (1), the other outputs S-1 to S-N are at a logical zero (0), which opens the corresponding switches S-1 to S-N and decouples Vgate from the gate terminals G of the corresponding PFETs 206-0 to 206-N. Accordingly, scan clock 218 in effect ripples a logical one (1) through outputs S-0 to S-N to sequentially close or activate switches 212-0 to 212-N, which allows Vgate to be sequentially applied to the gate terminal G of each one of PFETs 206-0 to 206-N.

In one or more embodiments, switches 212-0 to 212-N may be implemented as a double switch 220 having a first pole 222 and a second pole 224 as shown in FIG. 2. When pulse enable 202 is at a logical one (1), first pole 222 is open and second pole 224 is coupled to ground, which enables the pulse signals $P_0$ to $P_M$ generated at the duty cycles DC-0 to DC-M, along with DC 100% and DC 0% to pass in parallel to the gate terminals G of PFETs 206-0 to 206-N. When pulse enable 202 is at a logical zero (0), first pole 222 is closed and second pole 224 is coupled to ground for all of the switches 212-0 to 212-N with the exception of the one switch that corresponds to the active scan chain output. For the active scan chain output (i.e., a scan chain output at a logical one (1)), second pole 224 is coupled to Vgate, which applies Vgate to the gate terminal G of the active scan chain's corresponding PFET. Accordingly, the double switch configuration grounds all of the gates of the PFETs except the PFET that is currently being measured.

Figure 3:
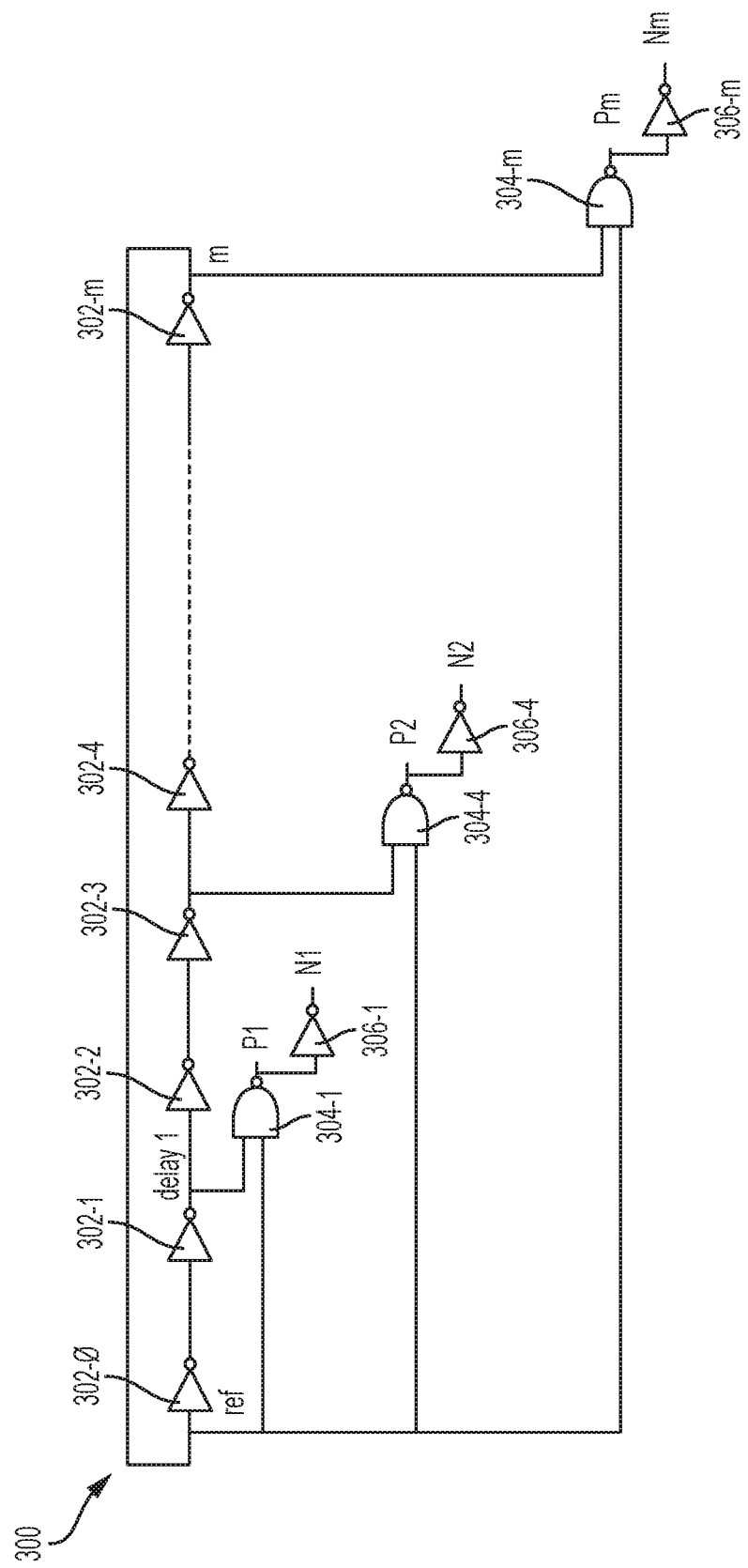
FIG. 3 depicts a schematic diagram of a pulse generation circuit according to one or more embodiments.

FIG. 3 depicts a schematic diagram of a ring oscillator circuit 300, which may be used to implement pulse generator 204 (shown in FIG. 2). Ring oscillator 300 includes a plurality of inverters 302-0 to 302-m, where m equals the total number of duty cycles (DC-0 to DC-M) generated by pulse generator 204. In general, a ring oscillator circuit is a device having an odd number of inverters whose output oscillates between two voltage levels representing logical zero (0) and logical one (1). The inverters are attached in a chain, and the output of the last inverter is fed back into the first. Ring oscillator circuit 300 and inverters 302-0 to 302-m operate in the above-described conventional manner except pulses are generated at different duty cycles DC-0 to DC-M by tapping into ring oscillator 300 at different locations (i.e., "stages") along the chain of inverters 302-0 to 302-m. The tapped stages of ring oscillator 300 are provided as one input to a corresponding string of NAND gates 304-1 to 304-m. The output of ring oscillator 300 is provided as another input to the corresponding string of NAND gates 304-1 to 304-m. Other taps of the ring oscillator may be inputs to the NANDs. The output of each one of NAND gates 304-1 to 304-m provides one of the pulse signals $P_1$ to $P_M$ at a desired duty cycle. Optionally, inverted versions of $P_1$ to $P_M$ may be generated by running $P_1$ to $P_M$ through inverters 306-1 to 306-M to generate pulses $N_1$ to $N_M$ at the opposite duty cycles. For example, if a pulse out of NAND gate 304-1 is at 25% DC, a 75% DC pulse can be generated by simply inverting the pulse out of NAND gate 304-1 using inverter 306-1. The duty cycles used for $P_0$ to $P_M$ may be different, may be all the same or may include some duty cycles that are the same and some duty cycles that are different.

Figure 4:
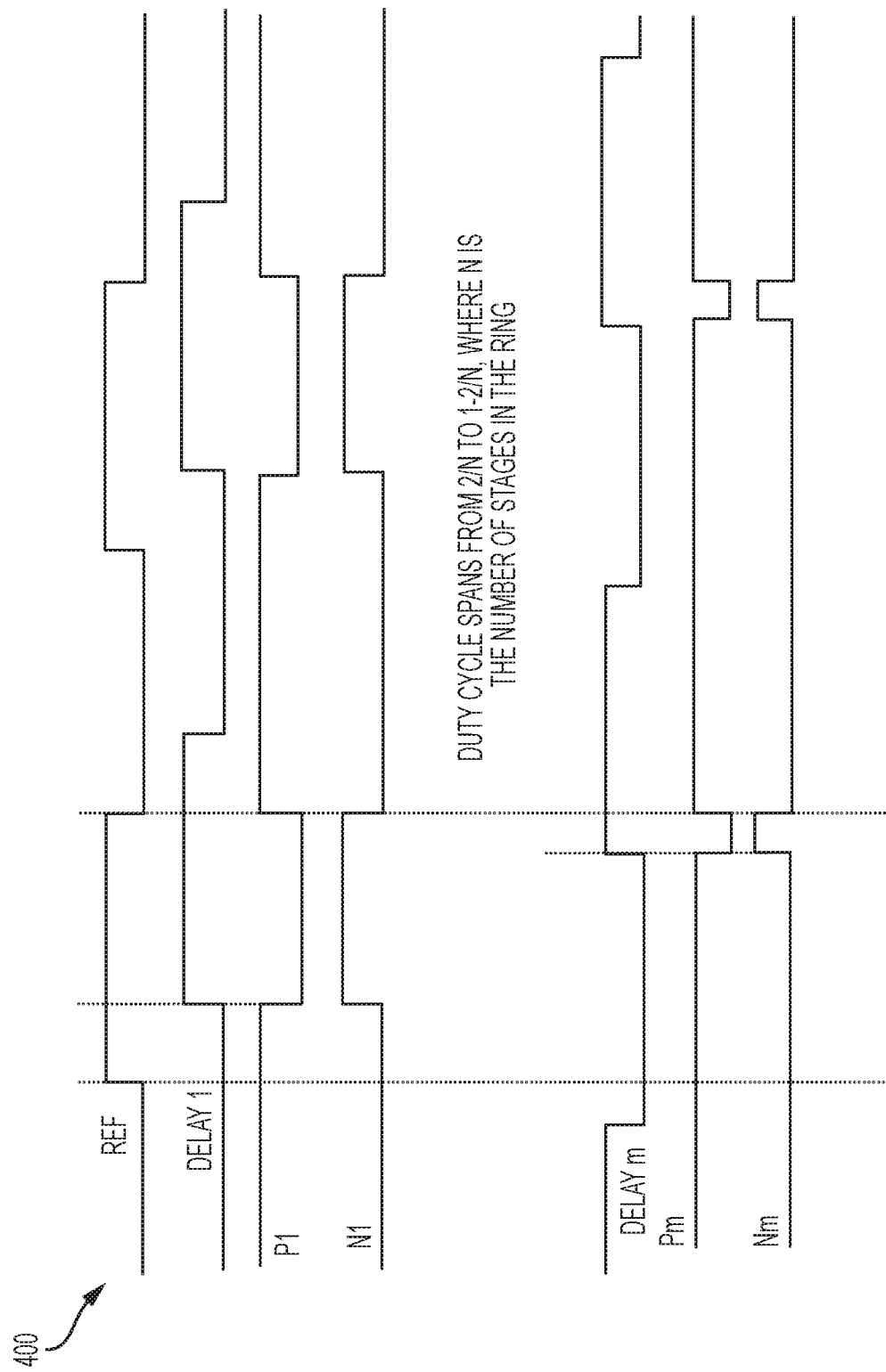
FIG. 4 depicts a timing diagram illustrating waveforms generated by the pulse generation circuit shown in FIG. 3.

FIG. 4 depicts waveforms 400, which illustrate how different duty cycles DC-0 to DC-M may be computed using ring oscillator 300. In general, the duty cycle is computed according to the equation DC=(pulse width)/(the ring oscillator period). If ring oscillator 300 (shown in FIG. 3) has m stages (where m is an odd number), and if the tap points going to NANDs 304-1 to 304-m are m stages apart, then the DC (for p signals)=(½)+(m/(2n)), where m=2, 4, 6, 8 . . . m−1, and the DC (for n signals)=(½)−(m/(2n)), where m=2, 4, 6, 8 . . . m−1. Accordingly, when using ring oscillator circuit 300, it is not necessary to know the delay per stage to compute the available duty cycles from the chose ring oscillator design. It is only necessary to know the number of stages in the ring and the pulse period to compute the available duty cycles. Other pulse generation circuits may be used, including for example a NOR gate configuration, or using tapping points that are spaced by odd numbers of stages.

Figure 5:
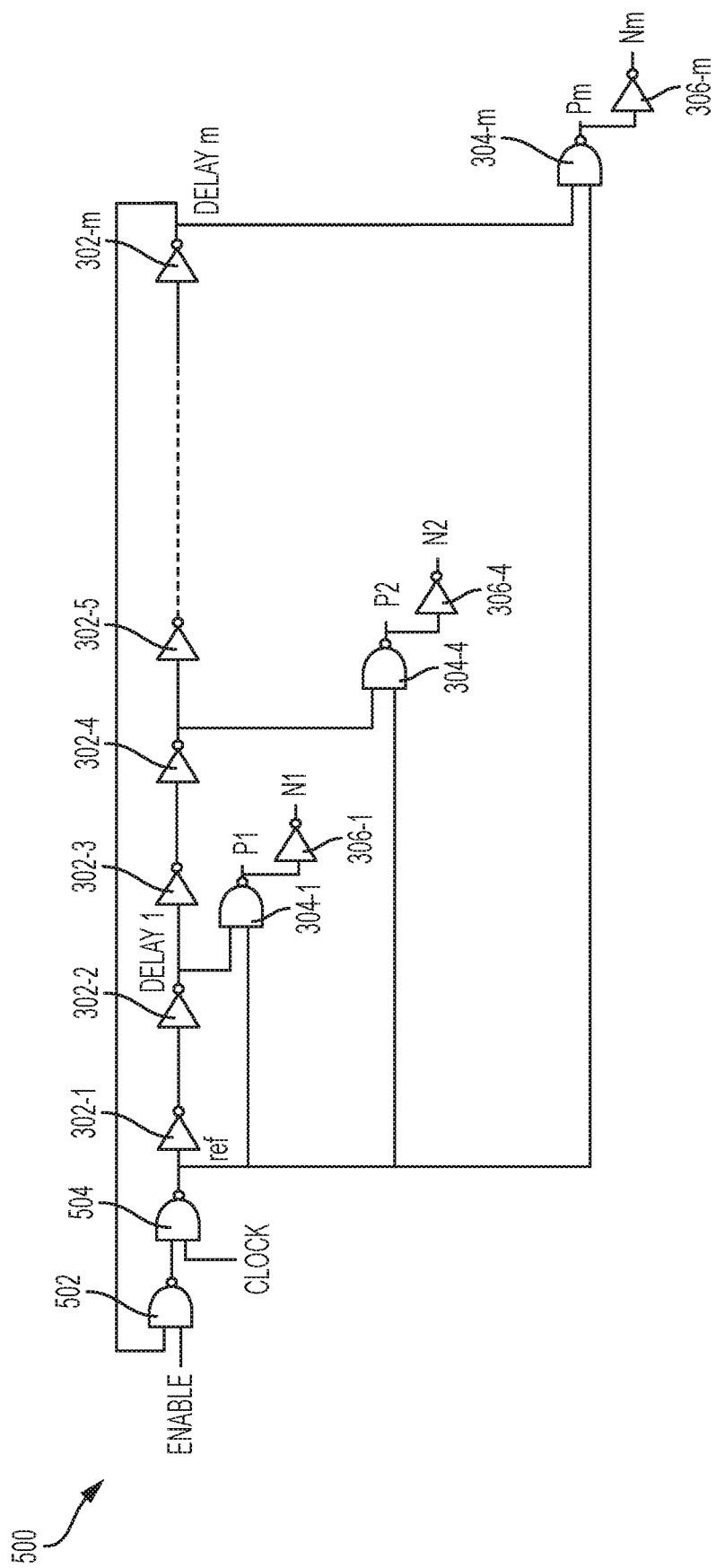
FIG. 5 depicts a schematic diagram of another pulse generation circuit according to one or more embodiments.

FIG. 5 depicts a schematic diagram of a ring oscillator circuit 500, which may be used to implement pulse generator 204 (shown in FIG. 2). Ring oscillator 500 is substantially the same as ring oscillator 300 (shown in FIG. 3) except that ring oscillator circuit 500 allows a greater range of attainable duty cycles by driving ring oscillator 500 using an enable signal, an external clock signal, a NAND gate 502 and a NAND gate 504, configured and arranged as shown. To achieve a greater range of attainable duty cycles using ring oscillator circuit 300, additional stages (i.e., inverters 306-M) must be added. However, ring oscillator circuit 500 provides more flexibility and a greater range of attainable duty cycles than ring oscillator circuit 300 in that ring oscillator 500 may be configured to operate substantially the same as ring oscillator circuit 300 wherein the range of attainable duty cycles is based on the number of stages in the ring oscillator, or it may be configured to operated as a delay chain when the duty cycle is determined by the externally generated clock signal, which allows a greater range of attainable duty cycles without the penalty of adding additional inverter stages.

FIG. 6 depicts a table 600 illustrating operation of ring oscillator circuit 300 (shown in FIG. 3) implemented in system 200 (shown in FIG. 2). To configure ring oscillator circuit 500 to operate substantially the same as ring oscillator circuit 300 (shown in FIG. 3), the enable signal is set to a logical one (1) and the clock signal is set to a logical one (1). To configure ring oscillator circuit 500 to operate in an extended mode wherein the range of attainable duty cycles is determined by the externally generated clock signal, the enable signal is set to a logical zero (0) and the clock signal set to an external clock delay chain condition wherein the clock signal is toggled externally. In the external clock delay chain condition, the DC (p signals)=1−(mt/T), and the DC (n signals)=mt/T, where m=2, 4, 6, 8 . . . m−1, t is the delay of each stage, and T is the period of the external clock.

As shown in table 600, the operation methodology of system 200 (shown in FIG. 2) using ring oscillator circuit 300 (shown in FIG. 3) proceeds as follows. In operation 1, the scan chain is cleared, which sets all of the scan chain outputs to a logical zero (0) and loads a logical one (1) into the first scan chain output. In operation 2, the ring oscillator circuit 300 is started. In operations 3a and 3b, the FETs (NFETs or PFETs) are stressed in parallel for a desired period of time. In operations 4a and 4b, the FET currents are measured one FET at a time under control of scan chain 210 (shown in FIG. 2). The methodology then loops back to operation 3a and repeats as many times a desired. It is noted that there is no need to stop ring oscillator circuit 300 once it has been started. Additionally, initial pre-stress characterization operation may be applied to each FET device using a voltage in the range from 0.4V to about 0.6V. The voltage values shown for Vgate, Vdrain, Vmeasure and Vsource are illustrative examples and other values can be used according to the conditions of the measurement. The stress time typically increases logarithmically for each loop (i.e., each iteration of operations 3a, 3b, 4a, 4b). The stress current may be small for each FET device (e.g., <about 1 μA). The drain current during measurement may range from about 10 μA to about 1 mA.

Figure 7:
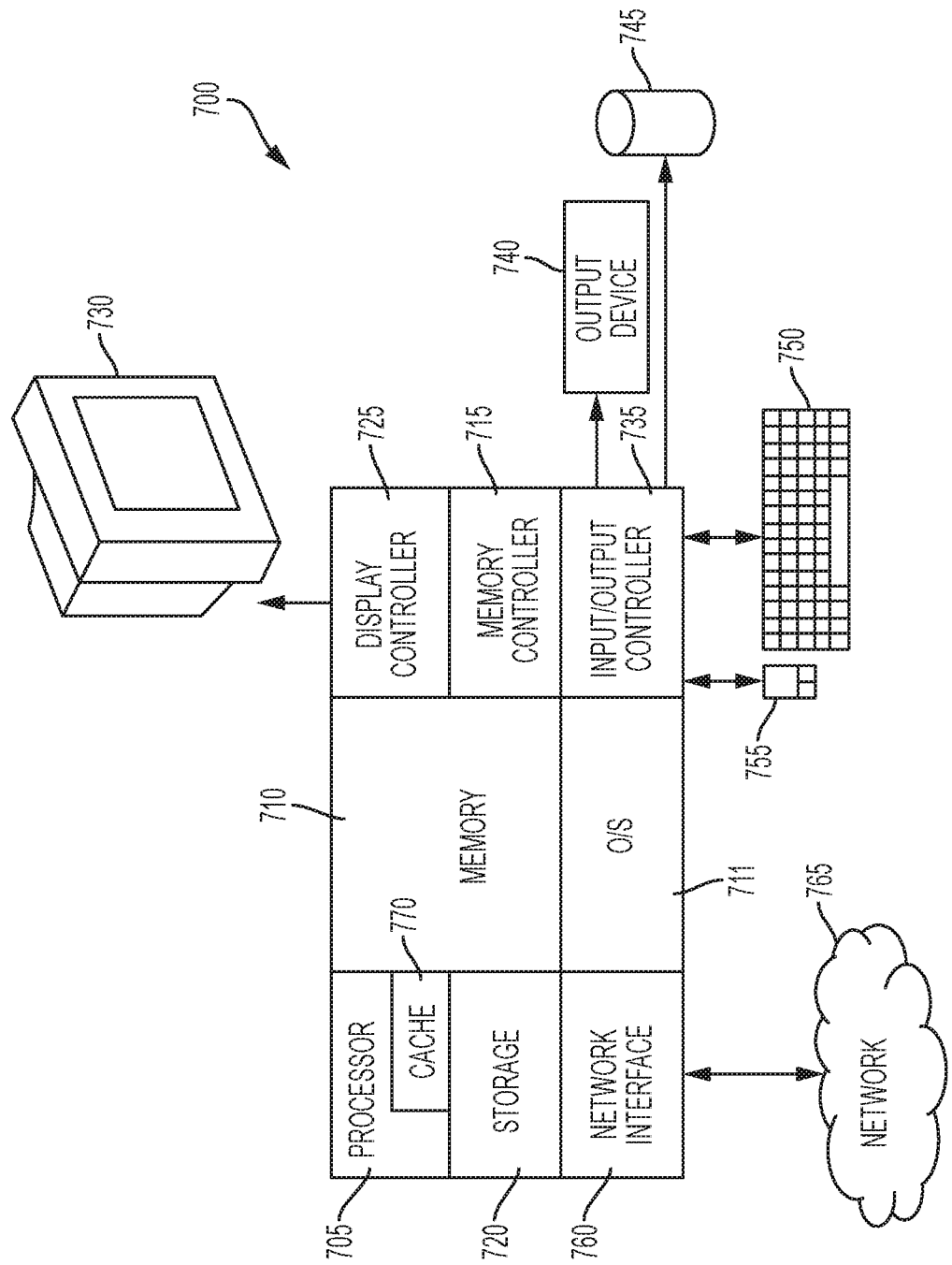
FIG. 7 depicts a computer system according to one or more embodiments.

FIG. 7 depicts a computer system 700 capable of implementing or more aspects of the present disclosure. Specifically, computer system 700 is capable of implementing at least performance degradation estimating component 190 (shown in FIG. 1), processor system 216, portions of the functionality of parallel stress controller 112 (shown in FIG. 1) and portions of the functionality of serial measuring controller 172 (shown in FIG. 1). The processing described herein may be implemented in hardware, software (e.g., firmware), or a combination thereof. In an exemplary embodiment, the methods described may be implemented, at least in part, in hardware and may be part of the microprocessor of a special or general-purpose computer system 700, such as a personal computer, workstation, minicomputer or mainframe computer.

In an exemplary embodiment, as shown in FIG. 7, computer system 700 includes a processor 705, memory 710 coupled to a memory controller 715, and one or more input devices 745 and/or output devices 740, such as peripherals, that are communicatively coupled via a local I/O controller 735. These devices 740 and 745 may include, for example, a printer, a scanner, a microphone, and the like. A conventional keyboard 750 and mouse 755 may be coupled to I/O controller 735. I/O controller 735 may be, for example, one or more buses or other wired or wireless connections, as are known in the art. I/O controller 735 may have additional elements, which are omitted for simplicity, such as controllers, buffers (caches), drivers, repeaters, and receivers, to enable communications.

I/O devices 740, 745 may further include devices that communicate both inputs and outputs, for instance disk and tape storage, a network interface card (NIC) or modulator/demodulator (for accessing other files, devices, systems, or a network), a radio frequency (RF) or other transceiver, a telephonic interface, a bridge, a router, and the like.

Processor 705 is a hardware device for executing hardware instructions or software, particularly those stored in memory 710. Processor 705 may be a custom made or commercially available processor, a central processing unit (CPU), an auxiliary processor among several processors associated with computer system 700, a semiconductor based microprocessor (in the form of a microchip or chip set), a macroprocessor, or other device for executing instructions. Processor 705 includes a cache 770, which may include, but is not limited to, an instruction cache to speed up executable instruction fetch, a data cache to speed up data fetch and store, and a translation lookaside buffer (TLB) used to speed up virtual-to-physical address translation for both executable instructions and data. Cache 770 may be organized as a hierarchy of more cache levels (L1, L2, etc.).

Memory 710 may include one or combinations of volatile memory elements (e.g., random access memory, RAM, such as DRAM, SRAM, SDRAM, etc.) and nonvolatile memory elements (e.g., ROM, erasable programmable read only memory (EPROM), electronically erasable programmable read only memory (EEPROM), programmable read only memory (PROM), tape, compact disc read only memory (CD-ROM), disk, diskette, cartridge, cassette or the like, etc.). Moreover, memory 710 may incorporate electronic, magnetic, optical, or other types of storage media. Note that memory 710 may have a distributed architecture, where various components are situated remote from one another but may be accessed by processor 705.

The instructions in memory 710 may include one or more separate programs, each of which comprises an ordered listing of executable instructions for implementing logical functions. In the example of FIG. 7, the instructions in memory 710 include a suitable operating system (OS) 711. The operating system 711 essentially may control the execution of other computer programs and provides scheduling, input-output control, file and data management, memory management, and communication control and related services.

Additional data, including, for example, instructions for processor 705 or other retrievable information, may be stored in storage 720, which may be a storage device such as a hard disk drive or solid state drive. The stored instructions in memory 710 or in storage 720 may include those enabling the processor to execute one or more aspects of the systems and methods of the present disclosure.

Computer system 700 may further include a display controller 725 coupled to a display 730. In an exemplary embodiment, computer system 700 may further include a network interface 760 for coupling to a network 765. Network 765 may be an IP-based network for communication between the computer system 700 and an external server, client and the like via a broadband connection. Network 765 transmits and receives data between computer system 700 and external systems. In an exemplary embodiment, network 765 may be a managed IP network administered by a service provider. Network 765 may be implemented in a wireless fashion, e.g., using wireless protocols and technologies, such as WiFi, WiMax, etc. Network 765 may also be a packet-switched network such as a local area network, wide area network, metropolitan area network, the Internet, or other similar type of network environment. Network 765 may be a fixed wireless network, a wireless local area network (LAN), a wireless wide area network (WAN) a personal area network (PAN), a virtual private network (VPN), intranet or other suitable network system and may include equipment for receiving and transmitting signals.

Thus it can be seen from the foregoing detailed description that the present disclosure provides non-destructive testing systems and methodologies that efficiently and effectively apply BTI stress (e.g., a negative gate voltage) in parallel and at various duty cycles to circuit components (e.g., an array of PFETs), remove or discontinue the BTI stress, sequentially measure one or more circuit component performance characteristics (e.g., source/drain current) subsequent to the removal of the BTI stress, and use the one or more measured circuit component performance characteristics to determine an estimate of the circuit component performance degradation due to aging mechanisms. In one or more embodiments, the performance degradation is a difference between an initial one or more performance characteristics of each one of the electronic components and the one or more measured performance characteristic of each one of the electronic components. The present disclosure may be implemented in a variety of configurations to provide feedback on performance degradation of electronic components due to aging mechanisms. For example, the present disclosure may be implemented inline as one or more operations of an IC fabrication process, as a bench test after IC fabrication, or as an on-chip system built into the IC.

In some embodiments, various functions or acts may take place at a given location and/or in connection with the operation of one or more apparatuses or systems. In some embodiments, a portion of a given function or act may be performed at a first device or location, and the remainder of the function or act may be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There may be many variations to the diagram or the steps (or operations) described therein without departing from the spirit of the disclosure. For instance, the actions may be performed in a differing order or actions may be added, deleted or modified. Also, the term "coupled" describes having a signal path between two elements and does not imply a direct connection between the elements with no intervening elements/connections therebetween. All of these variations are considered a part of the disclosure.

It will be understood that those skilled in the art, both now and in the future, may make various improvements and enhancements which fall within the scope of the claims which follow.

What is claimed is:

1. A system for measuring a-performance characteristics of a plurality of electronic components comprising at least a first electronic component and a second electronic component, the system comprising:
   a parallel stress generator communicatively coupled to the first electronic component and the second electronic component; and
   a serial electronic measuring component communicatively coupled to the first electronic component and the second electronic component;
   wherein the parallel stress generator is configured to generate a plurality of stress signals comprising at least a first stress signal and a second stress signal;
   wherein the parallel stress generating is further configured to generate the first stress signal, apply the first stress signal to only the first electronic components, and remove the first stress signal from the first electronic component;
   wherein the parallel stress generator is further configured to generate the second stress signal, apply the second stress signal to only the second electronic component, and remove the second stress signal from the second electronic component; and wherein the serial electronic measuring component is configured to, subsequent to the removal of the first stress signal from the first electronic component, and subsequent to the removal of the second stress signal from the second electronic component, sequentially measure a performance characteristic of the first electronic component and a performance characteristic of the second electronic component.

2. The system of claim 1 wherein the plurality of stress signals comprises a plurality of duty cycles.

3. The system of claim 1 further comprising:
a performance degradation estimating component communicatively coupled to the serial electronic measuring component;
wherein the performance degradation estimating component estimates a performance degradation of the first electronic component based at least in part on the performance characteristic of the first electronic component and the performance characteristic of the second electronic component.

4. The system of claim 1, wherein the parallel stress generator comprises:
a parallel stress controller; and
a stress generator;
wherein the stress generator is configured to generate the plurality of stress signals;
wherein the parallel stress controller is configured to control the stress generator to apply the plurality of stress signals in parallel to the plurality of electronic components, and then remove the plurality of stress signals from the plurality of electronic components.

5. The system of claim 1, wherein the serial electronic measuring component comprises:
a serial measuring controller; and
an electronic measuring component;
wherein the electronic measuring component is configured to measure the performance characteristic of each one of the plurality of electronic components;
wherein the serial measuring controller is configured to control the electronic measuring component to, subsequent to the removal of the first stress signal from the first electronic component, and subsequent to the removal of the second stress signal from the second electronic component, sequentially measure the performance characteristic of the first electronic component and the performance characteristic of the second electronic component.

6. A system for measuring performance characteristics of a plurality of electronic components comprising at least a first electronic component and a second electronic component, the system comprising:
a parallel stress generator communicatively coupled to the first electronic component and the second electronic component;
a serial measuring controller comprising a plurality of switches, wherein the serial measuring controller is communicatively coupled to the first electronic component and the second electronic component; and
an electronic measuring component communicatively coupled to the plurality of electronic components;
wherein the parallel stress generator is configured to generate a plurality of stress signals comprising at least a first stress signal and a second stress signal;

wherein the parallel stress generator is further configured to generate the first stress signal, apply the first stress signal to only the first electronic component, and remove the first stress signal from the first electronic component;
wherein the parallel stress generator is further configured to generate the second stress signal, apply the second stress signal to only the second electronic component, and remove the second stress signal from the second electronic component;
wherein the electronic measuring component is configured to measure a performance characteristic of the first electronic component and a performance characteristic of the second electronic component; and
wherein the serial measuring controller is configured to control the electronic measuring component to, subsequent to the removal of the first stress signal from the first electronic component, and subsequent to the removal of the second stress signal from the second electronic component, sequentially measure a performance characteristic of the first electronic component and a performance characteristic of the second electronic component by sequentially controlling each one of the plurality of switches to sequentially couple each one of the plurality of electronic components to the electronic measuring component.

7. The system of claim 6, wherein:
the serial measuring controller further comprises a scan chain or a state machine; and
the scan chain or the state machine is configured to sequentially control one of the plurality of switches to sequentially couple each one of the plurality of electronic components to the electronic measuring component.

8. The system of claim 6 wherein the plurality of stress signals comprises a plurality of duty cycles.

9. The system of claim 6 further comprising:
a performance degradation estimating component communicatively coupled to the serial electronic measuring component;
wherein the performance degradation estimating component estimates a performance degradation of the first electronic component based at least in part on the performance characteristic of the first electronic component and the performance characteristic of the second electronic component.

10. The system of claim 6, wherein the parallel stress generator comprises:
a parallel stress controller; and
a stress generator;
wherein the stress generator is configured to generate the plurality of stress signals;
wherein the parallel stress controller is configured to control the stress generator to apply the plurality of stress signals in parallel to the first electronic component and the second electronic component, and then remove the plurality of stress signals from the first electronic component and the second electronic component.

11. A system for estimating performance degradation of a plurality of electronic components at least a first electronic component and a second electronic component, the system comprising:
a parallel pulse controller;
a pulse generator communicatively coupled to the parallel pulse controller, the first electronic component, and the second electronic component;

a serial measuring controller comprising a plurality of switches, wherein the serial measuring controller is communicatively coupled to the plurality of electronic components;

an electronic measuring component communicatively coupled to the plurality of electronic components; and a performance degradation estimating component communicatively coupled to the electronic measuring component;

wherein the pulse generator is configured to generate a plurality of pulse signals comprising a plurality of duty cycles;

wherein the parallel pulse controller is configured to control the pulse generator to apply a first pulse signal of the plurality of pulse signals comprising the plurality of duty cycles to a first electronic component of the plurality of electronic components, and then remove the first pulse signal of the plurality of pulse signals comprising a plurality of duty cycles from the first electronic component of the plurality of electronic components;

wherein the parallel pulse controller is further configured to control the pulse generator to apply a second pulse signal of the plurality of pulse signals comprising the plurality of duty cycles to a second electronic component of the plurality of electronic components, and then remove the second pulse signal of the plurality of pulse signals comprising a plurality of duty cycles from the second electronic component of the plurality of electronic components;

wherein the electronic measuring component is configured to determine a measured performance characteristic of each electronic component of the plurality of electronic components;

wherein the serial measuring controller is configured to control the electronic measuring component to, subsequent to the removal of the plurality of pulse signals, sequentially determine the measured performance characteristic of each electronic component of the plurality of electronic components by sequentially controlling each switch of the plurality of switches to sequentially couple each electronic component of the plurality of electronic components to the electronic measuring component;

wherein the performance degradation estimating component estimates a performance degradation of each electronic component of the plurality of electronic components based at least in part on the measured performance characteristic of each electronic component of the plurality of electronic components.

12. The system of claim 11, wherein:
the pulse generator comprises a pulse generation circuit; and
the pulse generation circuit is configured to generate the plurality of pulse signals at the plurality of duty cycles.

13. The system of claim 12, wherein:
the pulse generation circuit comprises a ring oscillator circuit having a plurality of stages; and
the plurality of duty cycles are generated at least in part by tapping into the ring oscillator circuit at one stage of the plurality of stages.

14. The system of claim 11, wherein:
the serial measuring controller further comprises a scan chain or a state machine; and
the scan chain or the state machine is configured to sequentially control a switch of the plurality of switches to sequentially couple each electronic component of the plurality of electronic components to the electronic measuring component.

15. The system of claim 14, wherein:
the performance degradation comprises a difference between an initial performance characteristic of each electronic component of the plurality of electronic components and the measured performance characteristic of each electronic component of the plurality of electronic components;

the plurality of electronic components comprises a plurality of field-effect-transistors (FETs), wherein each FET of the plurality of FETs comprises a gate, a source and a drain;

the parallel pulse controller is configured to control the pulse generator to apply the plurality of pulse signals comprising the plurality of duty cycles in parallel to the gates of the plurality of FETs; and the scan chain or the state machine is configured to sequentially control each switch of the plurality of switches to sequentially:

pass an excitation voltage to the gate of each FET of the plurality of FETs; and couple each FET of the plurality of FETs to the electronic measuring component.

16. A method for measuring performance characteristics of a plurality of electronic components, the method comprising:

generating, using a parallel stress generator, a plurality of stress signals;

applying a first stress signal of the plurality of stress signals to only a first electronic component of the plurality of electronic components;

removing the first stress signal of the plurality of stress signals from the first electronic component of the plurality of electronic components;

applying a second stress signal of the plurality of stress signals to only a second electronic component of the plurality of electronic components;

removing the second stress signal of the plurality of stress signals from the second electronic component of the plurality of electronic components; and subsequent to the removal of the plurality of stress signals, sequentially measuring the performance characteristic of each electronic component of the plurality of electronic components.

17. The method of claim 16 wherein the plurality of stress signals comprises a plurality of duty cycles.

18. The method of claim 16 further comprising:
estimating, using a performance degradation estimating component, a performance degradation of each electronic component of the plurality of electronic components based at least in part on a performance characteristic of each electronic component of the plurality of electronic components.

19. The method of claim 16, wherein:
the parallel stress generator comprises a parallel stress controller and a stress generator;
the stress generator is utilized to generate the plurality of stress signals; and
a parallel stress controller is utilized to control the stress generator to apply the plurality of stress signals in parallel to the plurality of electronic components, and then remove the plurality of stress signals from the plurality of electronic components.

20. The method of claim 16, wherein:
- the serial electronic measuring component comprises a serial measuring controller and an electronic measuring component;
- the electronic measuring component is utilized to measure the performance characteristic of each electronic component of the plurality of electronic components; and
- the serial measuring controller is utilized to control the electronic measuring component to, subsequent to the removal of the plurality of stress signals, sequentially measure the performance characteristic of each electronic component of the plurality of electronic components.

21. A method for measuring-a performance characteristics of a plurality of electronic components, the method comprising:
- generating, using a parallel stress generator, a plurality of stress signals;
- applying a sequence of stress signals to the plurality of electronic components, the sequence comprising, for each of the plurality of electronic components:
  - applying one stress signal of the plurality of stress signals to only one electronic component of the plurality of electronic components; and
  - removing the one stress signal of the plurality of stress signals from the one electronic component of the plurality of electronic components; and
- subsequent to completion of applying the sequence of stress signals, sequentially measuring a performance characteristic of each electronic component of the plurality of electronic components by sequentially controlling each switch of a plurality of switches to sequentially couple each electronic component of the plurality of electronic components to an electronic measuring component.

22. The method of claim 21, wherein:
- the method further comprises using a scan chain or a state machine to sequentially control each switch of the plurality of switches to sequentially couple each electronic component of the plurality of electronic components to the electronic measuring component.

23. The method of claim 21 wherein the plurality of stress signals comprises a plurality of duty cycles.

24. The method of claim 21 further comprising:
- estimating, using a performance degradation estimating component, a performance degradation of each electronic component of the plurality of electronic components based at least in part on a performance characteristic of each electronic component of the plurality of electronic components.

25. The method of claim 21, wherein:
- the parallel stress generator comprises a parallel stress controller and a stress generator;
- the stress generator is utilized to generate the plurality of stress signals; and
- the parallel stress controller is utilized to control the stress generator to apply the plurality of stress signals in parallel to the plurality of electronic components, and then remove the plurality of stress signals from the plurality of electronic components.

* * * * *